United States Patent [19]

Lane et al.

[11] Patent Number: 5,401,692
[45] Date of Patent: Mar. 28, 1995

[54] METHOD FOR MINIMIZING PARTICLE GENERATION ON A WAFER SURFACE DURING HIGH PRESSURE OXIDATION OF SILICON

[75] Inventors: Andrew P. Lane, Westminster; Norris E. Tidwell, Plano, both of Tex.

[73] Assignee: Texas Instruments Incorporated, Dallas, Tex.

[21] Appl. No.: 77,217

[22] Filed: Jun. 15, 1993

[51] Int. Cl.⁶ .............................................. H01L 21/02
[52] U.S. Cl. .................................. 437/239; 427/300; 437/925
[58] Field of Search ................... 437/239, 925; 148/DIG. 118; 156/643; 427/96, 300

[56] References Cited

U.S. PATENT DOCUMENTS

| | | | |
|---|---|---|---|
| 3,644,154 | 2/1972 | Hoogendoorn et al. | 148/187 |
| 3,661,253 | 5/1972 | Cronkhite | 206/332 |
| 3,698,078 | 10/1972 | Redington | 148/DIG. 26 |
| 4,293,590 | 10/1981 | Takagi et al. | 427/93 |
| 4,599,247 | 7/1986 | Beam et al. | 427/93 |
| 4,718,975 | 1/1988 | Bowling et al. | |
| 5,314,896 | 5/1994 | Boitnott | 437/239 |

OTHER PUBLICATIONS

Wolf, Silicon Processing for the VLSI Era, vol-1--Process Technology, 1986, pp. 519-520 and 216-218.
Tsugouchi, IEE Transactions on Electronic-Devices, ED-29, 618-621 (1979).

*Primary Examiner*—Olik Chaudhuri
*Assistant Examiner*—S. Mulpuri
*Attorney, Agent, or Firm*—Richard L. Donaldson; John D. Crane

[57] ABSTRACT

A wafer 2 is supported polished (active) face down in a recess formed in the upper surface of a second wafer 4 which serves as a wafer support. The two wafers 2, 4 are disposed in an atmosphere of steam at 900° C. at a pressure of 500 psi which results in forming an oxide on the polished face of the wafer 2.

8 Claims, 1 Drawing Sheet

U.S. Patent      Mar. 28, 1995      5,401,692
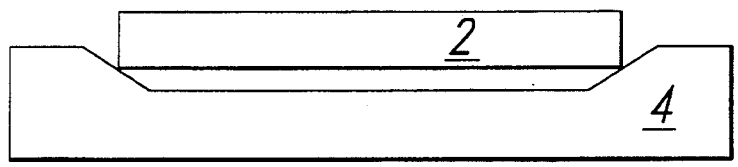
Fig. 1
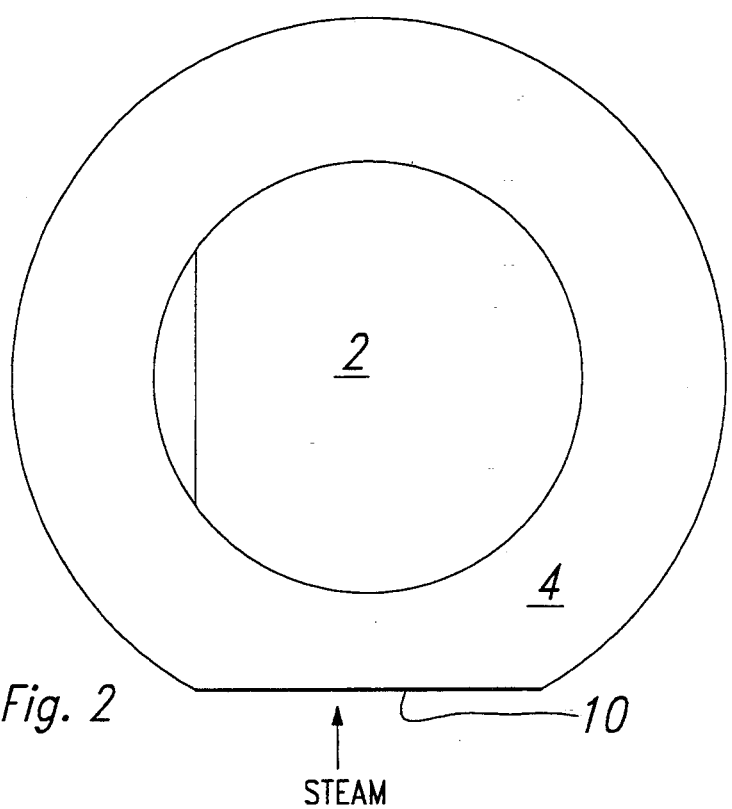
Fig. 2     ↑    —10
         STEAM

METHOD FOR MINIMIZING PARTICLE GENERATION ON A WAFER SURFACE DURING HIGH PRESSURE OXIDATION OF SILICON

This invention was developed under contract #F33615-88-C-5448 under the U.S. Air Force.

BACKGROUND OF THE INVENTION

The formation of particles during the high pressure oxidation of silicon in a quartz chamber is due to the solubility of quartz in steam at high temperature and pressure. This solubility phenomenum has received extensive coverage in the literature over the past fifty years (see American Journal of Science, 1977, 277, 1315–1351). The silicon dioxide (quartz, $SiO_2$) dissolved in the high pressure/temperature steam ambient undergoes gas phase nucleation resulting in spherical $SiO_2$ particles which are then deposited on the wafer surface by means of complex gas flows within the quartz reaction chamber.

The size of these particles, as determined using a WIS 8500 surface particle counter, vary from 0.3 $\mu$m to greater than 2 $\mu$m with the majority at about 0.9 to 1.1 $\mu$m. The number of particles generated exhibit a large variance. With the commercially available HiPOx ® (a batch high pressure oxidation reactor), produced by GaSonics/IPC, the number of particles will vary from reactor to reactor, typically, for instance, between 1,000 to 1,200 particles at a pressure of 10 atm. With a single wafer HiPOx, the number of particles can be as high as 110,000 at a pressure of about 50 atm. The data and results listed below were carried out using the single wafer HIPOx.

In the single wafer HiPOx, the vessel in which the oxidation occurs is a rectangular quartz chamber having the approximate dimensions of $9 \times 8 \times \frac{3}{8}$ inches so it will accommodate 150 mm wafers. This quartz chamber is located in a large stainless steel vessel capable of withstanding up to 1,500 psi (100 atmospheres) while still in the elastic deformation mode. The quartz chamber is pressurized by introducing a calculated volume of water (that which is required to provide the processing pressure at a given temperature) which is converted to steam by means of water heaters located prior to the quartz chamber. A zero pressure differential is effected by the introduction of nitrogen into the steel vessel; a link between the quartz chamber and the steel vessel is made through a quartz condensation tube which ensures a zero pressure differential.

In the single wafer HiPOx, under normal processing conditions with the wafer being processed face-down, an average of 110,000 particles are added; under the same conditions with the wafer being processed face-up, about 6,000 particles are added. The difference in particle numbers between face-up and face-down processing can be changed so that both surfaces have 110,000 particles by altering the buoyancy of the system. This is achieved by changing the relative temperatures of the chamber and the water heater which, in turn, causes a change in the complex convective flow system within the chamber.

Previous attempts to minimize particle generation in the commercially available batch reactor have included the use of some silicon carbide parts in the reaction chamber. Other attempts to reduce particle generation have focused on the careful cleaning of all reactor parts. None of these efforts have resulted in a suitable reduction of particles.

U.S. Pat. No. 4,718,975, issued Jan. 12, 1988 to Bowlling et al., addresses a method of reducing particle generation. However, this patent deals with the use of a particle shield to protect the wafer surface but is specifically limited to protection of the wafer during handling and transportation. Further, this patent is limited to reduced particle generation during wafer handling and transportation under vacuum processing conditions, i.e., wafer handling and transportation below atmospheric pressure. Until now, no effective method of particle reduction has existed for use with high pressure systems, i.e., 1 atm. to 100 atm and greater during wafer processing.

SUMMARY OF THE INVENTION

A method and device are disclosed for shielding a wafer and reducing contaminant particles during high pressure oxidation processing.

BRIEF DESCRIPTION OF THE DRAWINGS

FIG. 1 illustrates a cross sectional view of a 100 mm wafer positional polished face down in a recess milled into a 150 mm wafer.

FIG. 2 illustrates a top view of two 100 mm wafers with their flats positioned as shown for use in the reactor.

Applicable reference numbers and labels have been carried forward.

DETAILED DESCRIPTION OF THE INVENTION

As a result of several experiments, it has been recognized that shielding the edge and the surface of a wafer during high pressure oxidation processing results in a major reduction of particles deposited on the wafer as compared with a non-shielded wafer; this takes place regardless of whether the wafer is face-up or face-down. For instance, oxidation with greatly reduced particle deposition occurred between two wafers in a face to face position wherein the faces were contacting one another. The number of particles measured on the surface of these wafers ranged from 19 to 79. Furthermore, it should be noted that even with the wafers contacting one another the oxidation rate is not significantly effected. For example, oxidation of a 100 mm wafer in contact with a 150 mm wafer at 900° C. and 500 psi, gave an oxide thickness of 580 nm in the contacting area while the unshielded part of the 150 mm wafer was only 20 nm thicker. This demonstrates that mass transport, under these conditions, is excellent even with the wafers contacting one another.

In order to simulate a shielding mechanism which could be used in a commercially available reactor, a 100 mm recess, 0.27 mm deep, was machined in the center of 150 mm wafer such that a 100 mm wafer could be placed in this recess without the polished face of the 100 mm wafer contacting the 150 mm wafer. In other words, the edges of the recess support the 100 mm wafer which is positioned face-down in the recess. FIG. 1 is a drawing which illustrates a cross sectional view of a 100 mm wafer 2 positioned polished face-down in the recess milled into the 150 mm wafer 4. As discussed earlier, this positioning of the 100 mm wafer will have little effect on the oxidation rate.

Conventional wafers are in the shape of a circle truncated along a chord of the circle at an area referred to as the flat of the wafer.

A typical experimental set-up for the wafer configuration is shown in FIG. 2 which illustrates a top view of the two wafers with their flats 10 positioned as shown for processing in the reactor. In FIG. 2, the flat 10 of the 100 mm wafer 2 is at 90° to the flat 10 of the recessed 150 mm wafer 4. The general direction from which steam is introduced into the reactor is indicated by the arrow in FIG. 2. It should be noted that the position of the flat 10 of the 150 mm wafer 4 does not change relative to the steam direction.

Several oxidation experiments were carried out in which the flat 10 of the 100 mm wafer 2 was positioned at 0%, 90%, and 180° to the flat 10 of the 150 mm wafer 4. Approximately 600 nm of oxide was grown at a temperature of 900° C. and a pressure of 500 psi. After the oxidation experiments, the surface particles were counted using the WIS 8500 and found to vary between 49 and 145, a considerable reduction compared to the 110,00 normally observed without the shield (initial particle values for these wafers, prior to oxidation, were not obtained).

Two experiments were carried out in which the particles were measured before and after the oxidation process. In both these experiments, the flat 10 of the 100 mm wafer 2 was at 0° to the flat 10 of the recessed 150 mm wafer 4. The overall results of these experiments were that 65 particles were added to one wafer while the other had 13 less particles than the count prior to the oxidation process; Table 1 shows the particle data for these two experiments in terms of the particle size distribution.

TABLE 1

| Particle Size um | Particle Count-Pre | Particle Count-Post | Delta Particle Count |
|---|---|---|---|
| Experiment 1 | | | |
| 0.15 | 9 | 1 | −8 |
| 0.2 | 11 | 7 | −4 |
| 0.3 | 2 | 1 | −1 |
| 0.4 | 2 | 1 | −1 |
| 0.5 | 5 | 3 | −2 |
| 0.75 | 0 | 0 | 0 |
| 0.9 | 1 | 7 | 6 |
| 1 | 1 | 13 | 12 |
| 1.5 | 1 | 27 | 26 |
| 2 | 47 | 84 | 37 |
| Total | 79 | 144 | 65 |
| Experiment 2 | | | |
| 0.15 | 17 | 1 | −16 |
| 0.2 | 24 | 8 | −16 |
| 0.3 | 7 | 3 | −4 |
| 0.4 | 0 | 0 | 0 |
| 0.5 | 1 | 1 | 0 |
| 0.75 | 4 | 1 | −3 |
| 0.9 | 3 | 11 | 8 |
| 1 | 3 | 16 | 13 |
| 1.5 | 0 | 18 | 18 |
| 2 | 46 | 33 | −13 |
| Total | 105 | 92 | −13 |

The above experiments have clearly demonstrated that shielding a wafer during high pressure steam oxidation in a single wafer reactor reduces the number of particles deposited on a wafer by at least three orders of magnitude. Furthermore, the position of the flat 10 of the 100 mm wafer 2 relative to the steam direction, where the majority of turbulence is expected to occur, has little or no effect on the number of particles (this is not a problem for 200 mm wafers or larger since they do not have flats). By careful design of a shield such that the surface and edge of the wafer are fully protected, even better reduction in particle deposition could be obtained.

The data and results listed previously were carried out using the single wafer HiPOx ®. While the shield was shown to be successful for the case of the single wafer high pressure oxidation reactor, this technique for particle minimization can easily be adapted to the commercially available batch high pressure reactors. Knowledge of the steam flow patterns and design and fabrication of suitable shields could significantly reduce particle levels on the wafer surfaces and thus have a major impact on all semiconductor manufacturing companies employing high pressure oxidation. With decreasing device geometries and the need to reduce the thermal budget, high pressure oxidation of silicon is a most desirable choice. Also, the decrease in oxidation rate with decreasing device geometries below $1\mu$ becomes less serious with increasing pressure.

Although the invention has been described in detail herein with reference to its preferred embodiment and certain described alternatives, it is to be understood that this description is by way of example only, and is not to be construed in a limiting sense. Further, the invention is suitable for the high pressure, low temperature steam reflow of borophosphosilicate glass. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the spirit and true scope of the invention as claimed below.

We claim:

1. A method for minimizing contaminant particle formation on the active surface of a wafer during semiconductor device fabrication, the method comprising the steps of:
   supporting a wafer in a depression formed in the upper surface of a wafer support, said wafer being disposed with its active surface facing down in the depression of said wafer support; and
   introducing steam at a pressure greater than one atmosphere into the region between the active surface of said wafer and said wafer support.

2. A method as recited in claim 1 wherein said fabrication is selected from the group consisting of high pressure steam oxidation of said wafer or high pressure steam reflow of borophosphosilicate glass deposited on said wafer.

3. A method as recited in claim 1 wherein said depression is substantially circular in shape with a sloping side wall which engages the wafer only along its circumference.

4. A method as recited in claim 1 wherein the material comprising said wafer support is silicon.

5. A method as recited in claim 1 wherein the material comprising said wafer support includes material which will not contaminate said wafer during high pressure steam oxidation processing of said wafer.

6. A method as recited in claim 1, wherein ,steam is present in the oxidizing ambient but does not comprise 100% by volume of said ambient.

7. A method for minimizing contaminant particle generation on a wafer during high pressure oxidation of said wafer in an oxidation reactor comprising:
   placing said wafer in a recessed portion of a second wafer so that the desired portion to receive said oxidation faces said recessed portion; and
   introducing an oxidizing gas into the region between said wafer and the recessed portion of said second wafer.

8. A method as recited in claim 7 wherein said wafers are pre-cleaned prior to said processing.

* * * * *